Aug. 29, 1961 J. W. HASKELL 2,998,533

TRANSISTOR PHASE SENSITIVE AMPLIFIER

Filed June 16, 1958

INVENTOR.
John W. Haskwell.
BY
G. H. Strickland
His Attorney.

United States Patent Office 2,998,533
Patented Aug. 29, 1961

2,998,533

TRANSISTOR PHASE SENSITIVE AMPLIFIER

John W. Haskell, Rochester, N.Y., assignor to General Motors Corporation, Detroit, Mich., a corporation of Delaware Filed June 16, 1958, Ser. No. 742,413
8 Claims. (Cl. 307—88.5)

This invention pertains to amplifiers, and particularly to a phase sensitive amplifier.

Phase sensitive amplifiers have been designed heretofore wherein alternating current power is supplied to the output stage so as to accept or reject an input signal depending upon the phase relationship between the input signal and the power supply. The present invention relates to a simplified phase sensitive transistor amplifier having a single ended output stage and having a pulsating direct current power in the load circuit. Accordingly, among my objects are the provision of a phase sensitive transistor amplifier having an input gain stage, a driver stage and an output stage; the further provision of an amplifier of the aforesaid type including means for stabilizing amplifier gain during variations in line voltage; and the still further provision of an amplifier of the aforesaid type including phase discrimination means in the driver stage.

The aforementioned and other objects are accomplished in the present invention by incorporating a compensation circuit in the gain stage of the amplifier and supplying half-wave rectified power to the driver stage to obtain phase discrimination. While the amplifier is shown in combination with a thermistor bridge as the input signal source and a solenoid coil as the output load, this illustration is only exemplary and is not to be construed by way of limitation. Specifically, the amplifier includes three transistors, each having a base, a collector and an emitter. The first stage of the amplifier consists of a transistor operated in the grounded emitter connection, and the alternating current input signal is impressed on the base. The collector is connected to the filtered output of a full wave rectifier.

The base current bias of the first transistor is derived from a voltage divider comprising two resistors connected across the output of the full wave rectifier energized from the same alternating current source which supplies power to the thermistor bridge and amplifier. The base current bias of the first transistor increases with an increase in the voltage of the alternating current supply and decreases with a decrease in the voltage in the alternating current supply so as to shift the transistor into a lower gain region and a higher gain region, respectively, during increases and decreases in supply voltage. The signal gain of the thermistor bridge and the remaining two stages of the amplifier vary in an opposite sense with these changes in the alternating current supply so that by properly proportioning the changes in the base current bias of the first transistor, the over-all gain of the combined thermistor bridge and amplifier is stabilized against line voltage variations.

The driver stage of the amplifier consists of a transistor operated in the common collector connection. The amplified signal from the first stage is applied to the base of the second transistor through a coupling capacitor, and the load connected in the emitter circuit of the second transistor comprises a storage capacitor connected in parallel with the input of the power stage. Half wave rectified power is supplied to the collector of the second transistor, such that the collector is energized for only one-half of each cycle of the supply source frequency, and thus the driver stage transistor will only conduct when the input signal to the base is in phase with the power supply to the collector. The output of the driver stage is essentially direct current since the storage capacitor in the emitter circuit stores energy to supply the input circuit of the power stage during the nonconducting half cycle of the driver stage.

The power stage is single ended and consists of a power transistor operated in the grounded emitter connection. The input signal is operated from the driver stage through a resistor so that the storage capacitor in the driver stage will not be completely discharged during the nonconducting periods of the driver stage. The collector of the power stage is connected to the full wave rectified power source, and the load is connected in the collector circuit.

In operation, the phase of the input signals in the disclosed embodiment will vary with the temperature to which the thermistor bridge is exposed. Thus, when the temperature is above the temperature setting of the thermistor bridge, the input signal will have one phase, and when the temperature is below the temperature setting of the thermistor bridge the signal will have an opposite phase. When the controlled temperature is equal to the temperature setting of the thermistor bridge, the thermistor bridge will not produce any output signal. The phase sensitive amplifier is designed to respond to signals from the thermistor bridge when the temperature is below the temperature setting thereof. Under these conditions, the amplified signal supplied to the driver stage will be in phase with the half wave power supplied to the collector of the driver stage. On the other hand, when the control temperature is above the temperature setting of the thermostat, the input signal to the driver stage will be exactly out of phase with the pulsating power supply for the collector of the driver stage so that under these conditions there will be no input signal to the power stage and thus no current will flow through the load circuit.

Further objects and advantages of the present invention will be apparent from the following description, reference being had to the accompanying drawing, wherein a preferred embodiment is clearly shown.

Figure 1:
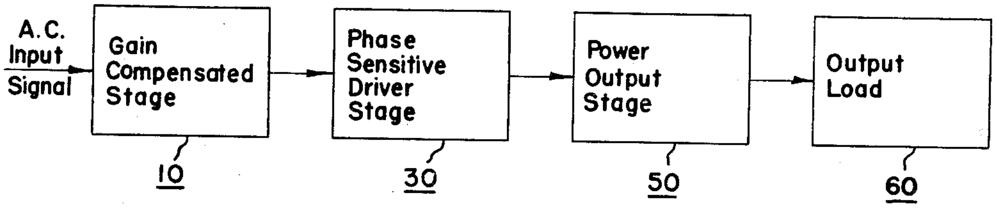
FIGURE 1 is a block diagram of an amplifier constructed according to the present invention.
Figure 2:
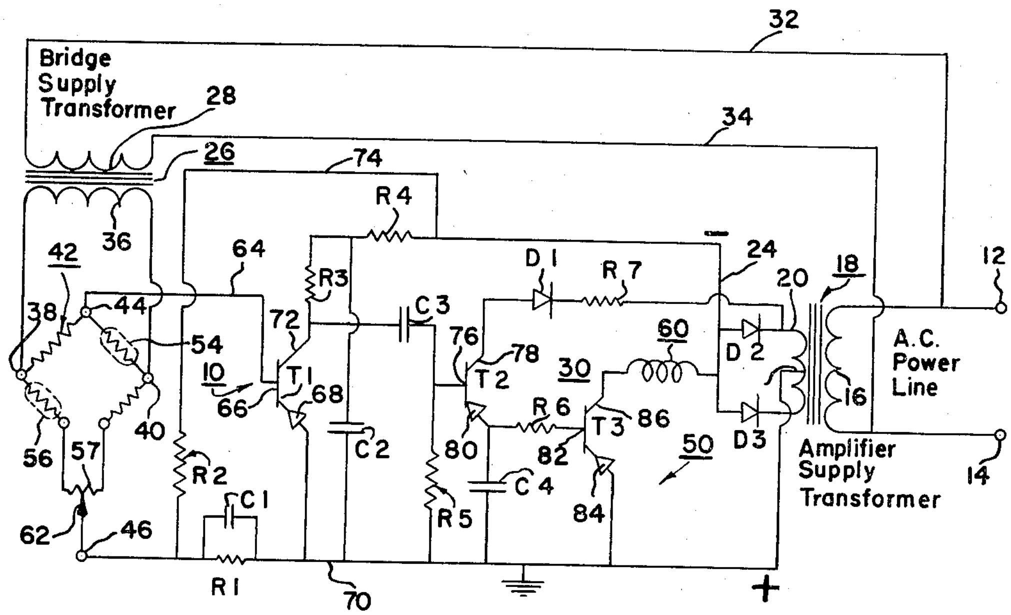
FIGURE 2 is a schematic circuit diagram of the amplifier having a thermistor bridge signal input source and a solenoid coil as the load.

With particular reference to FIGURE 1, the amplifier comprises three stages, namely a gain compensated input stage 10, a phase sensitive driver stage 30 and a power output stage 50 which is connected to a load 60. Referring to FIGURE 2, unregulated alternating current power is supplied to terminals 12 and 14 which are connected to a primary winding 16 of a transformer 18. The transformer 18 has a secondary winding 20 with a center tap at 22. Opposite ends of the secondary winding 20 are connected with rectifiers D2 and D3 whereby full wave rectified unfiltered direct current is supplied to conductor 24.

A second transformer 26 has its primary winding 28 connected across the input supply terminals 12 and 14 by conductors 32 and 34, respectively. The transformer 26 includes a secondary winding 36, opposite ends of which are connected to input terminals 38 and 40 of a thermistor bridge designated generally by the numeral 42. The thermistor bridge 42 also includes output terminals 44 and 46. The thermistor bridge 42 includes fixed resistors 48 and 52 in opposed legs thereof and thermistors 54 and 56 having negative temperature coefficients in the other two opposed legs thereof. The legs containing resistor 52 and thermistor 56 are connected to opposite ends of a potentiometer 57 having a slider 62 which is connected to the output terminal 46. The potentiometer 57 is adjusted to balance the thermistor bridge at the desired temperature.

When the controlled temperature equals the temperature setting of the thermistor bridge 42, a null condition exists wherein no signal voltage is present across terminals 44 and 46. However, when the control temperature differs from the temperature setting of the thermistor bridge, the thermistor bridge becomes unbalanced and the signal voltage appears across terminals 44 and 46. Since the input terminals 38 and 40 of the thermistor bridge are supplied with alternating current from the transformer 26, the signal voltage across the output terminals 44 and 46 will have one phase when the control temperature is below the temperature setting of the thermistor bridge, and an opposite phase when the control temperature is above the temperature setting of the thermistor bridge. In the particular embodiment shown, when the control temperature is below the temperature setting of the thermistor bridge 42 the resistance of the leg including thermistor 56 and a portion of the potentiometer 57 will be greater than the resistance of the leg containing resistor 48 so that the signal across output terminals 44 and 46 will be in phase with the alternating current signal of the supply from terminals 12 and 14. A like relationship will occur in the legs containing thermistor 54 and resistor 52 and the other portion of the potentiometer 57.

On the other hand, when the controlled temperature is above the temperature setting of the thermistor bridge, the resistance of the leg including the thermistor 56 and a portion of the potentiometer 57 will be less than the resistance of the leg including the resistor 48. Accordingly, terminal 46 will be at a higher potential than the terminal 44 so that the signal across the output terminal will be out of phase with the alternating current supply from terminals 12 and 14. A like relationship will occur in the legs containing thermistor 54 and resistor 52 and the other portion of the potentiometer 57.

The output terminal 44 is connected by a conductor 64 to the base of a first transistor T1 of the p-n-p type. The emitter 68 of the first transistor is connected to the ground conductor 70 which connects with the center tap 22 on the secondary winding 20 of the transformer 18. The collector 72 of the transistor T1 is connected through resistors R3 and R4 to the conductor 24, which is supplied with full wave rectified, unfiltered direct current. A capacitor C2 is connected between the junction of resistors R3 and R4 and the ground connector 70. The resistor R4 and the capacitor C2 comprise a filter so that filtered direct current is supplied to the collector 72. A resistor R1 is connected in series between conductor 70 and the output terminals 46, resistor R1 being shunted by a capacitor C1. A resistor R2 has one end connected to the output terminal 46 and the other end connected to a conductor 74, the resistors R1 and R2 constituting a voltage divider for supplying base bias to transistor T1. The resistors R1 and R2 constitute a compensating circuit for stabilizing the gain of the amplifier bridge combination irrespective of variations in the A.C. input voltage supplied to terminals 12 and 14. Thus, the input signal from the thermistor bridge 42 is impressed directly upon the base 66 of the transistor T1. The resistors R1 and R2 are chosen so that variations in the input supply voltage will control the gain of the transistor T1 so that the transistor T1 will substantially cancel concurrent gain variations in the thermistor bridge 42, the driver stage 30 and the power output stage 50. This is accomplished by variations in the base current bias of the transistor T1 whereby during increases in the input supply voltage, the transistor T1 is shifted to a lower gain region of operation, and during a decrease in the input supply voltage, the transistor T1 operates in a higher gain region.

The output signal of the first stage transistor is applied to the base 76 of a second transistor T2 of the p-n-p type through a coupling capacitor C3. A dropping resistor R5 is connected between the base 76 and the ground conductor 70. The collector 78 of the transistor T2 is connected by a half wave rectifier D1 and a resistor R7 to one end of the secondary winding 20 of the transformer 18. Thus, the collector 78 of the driver stage 30 is energized for only one-half of each cycle, and accordingly, it will respond only to in phase signals applied to the base 76. The emitter 80 of the transistor T2 is connected through a storage capacitor C4 to the ground conductor 70. In addition, the emitter 80 is connected by a resistor R6 to the base 82 of transistor T3 in the power output stage. The capacitor C4 is sufficiently large so that the circuit formed by capacitor C4 and resistor R6 will have a time constant which will prevent the complete discharge of the capacitor C4 during the nonconducting half cycles of the transistor T2. Therefore, the output of the transistor T2 is essentially direct current.

The power stage 50 includes a transistor T3 of the p-n-p type having a grounded emitter 84 and a collector 86. The collector 86 is connected through a load in the form of a solenoid coil 60 to the full wave rectified, unfiltered direct current supply conductor 24.

Operation of the phase sensitive transistor amplifier is as follows. When the controlled temperature is equal to the temperature setting of the thermistor bridge 42, the bridge will be balanced and hence there will be no signal across the output terminals 44 and 46. However, when the control temperature is either above or below the temperature setting of the thermistor bridge, a signal voltage will appear across the output terminals 44 and 46. This signal will be applied to the base of the transistor T1 where it will be amplified and supplied to the base of the transistor T2. Since the transistor T2 is phase sensitive, if the signal applied to the base of the transistor T2 is in phase with the half wave direct current applied to the collector 78, an output signal will be developed across the capacitor C4 which will be applied to the base of the transistor T3. However, if the input signal to the driver stage 30 is out of phase with the half wave signals supplied to the collector of the driver stage, an output signal will not be developed across the capacitor C4. Since the input signal from the thermistor bridge is in phase with the alternate-current supply from terminals 12 and 14 when the controlled temperature is below the temperature setting of the thermostat bridge, the driver stage 30 will be conductive and the load coil 60 will be energized under these conditions. However, when the control temperature is above the temperature setting of the thermistor bridge, the driver stage 30 will be nonconductive and hence no current will flow through the coil 60 in the load circuit. The coil 60 can thus be conveniently used to control a heater, or furnace, so that heat will be supplied when the controlled temperature is below the temperature setting of the thermistor bridge, and will not be supplied when the control temperature is above the temperature setting of the thermistor bridge.

From the foregoing it is apparent that the present invention provides a simplified phase sensitive amplifier wherein the over-all gain of the amplifier is compensated for variations in line voltage, and wherein phase discrimination is accomplished in the driver stage rather than in the power stage. This particular arrangement permits symmetrical loading of the power supply with a single ended output stage, wherein pulsating direct current power is required in the output circuit.

While the embodiment of the invention as herein disclosed constitutes a preferred form, it is to be understood that other forms might be adopted.

What is claimed is as follows:

1. A phase sensitive amplifying circuit arrangement including, first, second and third transistors each having a base, a collector and an emitter, means for impressing an input signal on the base of the first transistor, means deriving an output signal from the collector of the first transistor, the emitter of the first transistor being connected to a point for ground potential, means impressing the output signal of the first transistor on the base of the second transistor, a source of half wave rectified direct current, means connecting the collector of the second transistor to the source of the half wave rectified direct current whereby said second transistor will operate as a phase discriminator, means deriving a direct current output signal from the emitter of the second transistor, means impressing the direct current output signal on the base of the third transistor, the emitter of the third transistor being connected to a point of ground potential, and means deriving an amplified direct current output signal from the collector of the third transistor.

2. A phase sensitive amplifying circuit arrangement including, a signal source, first, second and third transistors each having a base, a collector and an emitter, means connecting the base of the first transistor and said signal source, the emitter of said first transistor being connected to a point of ground potential, means deriving an output signal from the collector of the first transistor, means impressing the output signal on the base of the second transistor, a source of half wave rectified direct current, means connecting the collector of the second transistor to the source of half wave rectified direct current whereby the second transistor will operate as a phase sensitive discriminator, means deriving a direct current output signal from the emitter of the second transistor including a capacitor connected between the emitter of the second transistor and a point of ground potential, means impressing the direct current output signal on the base of the third transistor, the emitter of the third transistor being connected to a point of ground potential, and means deriving an amplified direct current output signal from the collector of the third transistor.

3. A phase sensitive amplifying circuit arrangement including, a signal source having a pair of terminals, first, second and third transistors each having a base, a collector and an emitter, means connecting one terminal of said signal source to the base of the first transistor, the emitter of the first transistor being connected to a point of ground potential, means deriving an amplified output signal from the collector of the first transistor, a source of unregulated alternating current potential, a full wave rectifier connected to said source of alternating current potential constituting the power supply for the collector of the first transistor, means impressing the output signal of the first transistor on the base of the second transistor, a half wave rectifier connected with said source of alternating current potential for supplying power to the collector of the second transistor whereby the second transistor will operate as a phase discriminator, means deriving a direct current output signal from the emitter of the second transistor, means impressing the direct current output signal on the base of the third transistor, the emitter of the third transistor being connected to a point of ground potential, and means connecting the collector of the third transistor to the full wave rectified power supply through a load across which an amplified direct current signal is developed.

4. A phase sensitive amplifying circuit arrangement including, a first, second and third transistor each having a base, a collector and an emitter, a signal source, means connecting the base of the first transistor and the signal source, the emitter of the first transistor being connected to a point of ground potential, means deriving an output signal from the collector of the first transistor, means impressing the output signal on the base of the second transistor, a source of half wave direct current constituting the power supply for the collector and the second transistor whereby the second transistor operates as a phase discriminator, a resistor connecting the emitter of the second transistor to the base of the third transistor, a storage capacitor connected between the emitter of the second transistor and a point of ground potential across which a direct current signal is developed when the signal impressed on the base of the second transistor is in phase with the power supply for the collector of the second transistor, the time constant of the capacitor and the resistor being sufficient to prevent the complete discharge of the capacitor during the nonconducting intervals of the second transistor, the emitter of the third transistor being connected to a point of ground potential, and means deriving an amplified direct current output signal from the collector of the third transistor.

5. A phase sensitive amplifying circuit arrangement including, a source of alternating current potential, an input signal source energized from said source of alternating current for developing an input signal, the phase of said input signal being either the same or opposed to the phase of the source of alternating current, first, second and third transistors each having a base, a collector and an emitter, means for impressing the input signal on the base of the first transistor, means deriving an amplified output signal from the collector of the first transistor, the emitter of the first transistor being connected to a point of ground potential, a half wave rectifier connected to said alternating current source, means impressing the output signal of the first transistor on the base of the second transistor, means connecting the collector of the second transistor with said half wave rectifier whereby the second transistor will operate as a phase discriminator, means deriving a direct current output signal from the emitter of the second transistor when the phase of the input signal is the same as the phase of the alternating current source, means applying the direct current output signal on the base of the third transistor, the emitter of the third transistor being connected to a point of ground potential, and means deriving an amplified direct current output signal from the collector of the third transistor.

6. A phase sensitive amplifying circuit arrangement including, a signal source having a pair of terminals, first, second and third transistors each having a base, a collector and an emitter, means connecting one terminal of said signal source to the base of the first transistor, the emitter of the first transistor being connected to a point of ground potential, means deriving an amplified output signal from the collector of the first transistor, a source of unregulated alternating current potential, a full wave rectifier connected to said source of alternating current potential constituting a power supply for the collector of the first transistor, a voltage divider connected across the full wave rectified power supply comprising first and second resistors, means connecting the junction of the first and second resistors to the other terminal of said signal source, means impressing the output signal of the first transistor on the base of the second transistor, a half wave rectifier connected with said source of alternating current potential for supplying power to the collector of the second transistor whereby the second transistor will operate as a phase discriminator, means deriving a direct current output signal from the emitter of the second transistor, means impressing the direct current output signal on the base of the third transistor, the emitter of the third transistor being connected to a point of ground potential, and means connecting the collector of the third transistor to the full wave rectified power supply through a load across which an amplified direct current signal is developed, said first and second resistors constituting a compensating circuit for controlling the gain of the first transistor such that the gain of the amplifying circuit remains stable with variations in the potential of the alternating current source.

7. A phase sensitive amplifying circuit arrangement including, a source of alternating current potential, an input signal source energized from said source of alternating current for developing an input signal, the phase of said input signal being either the same or opposed to the phase of the source of alternating current, first, second and third transistors each having a base, a collector, and an emitter, means for impressing the input signal on the base of the first transistor, means deriving an amplified output signal from the collector of the first transistor, the emitter of the first transistor being connected to a point of ground potential, a half wave rectifier connected to said alternating current source, means impressing the output signal of the first transistor on the base of the second transistor, means connecting the collector of the second transistor with said half wave rectifier whereby the second transistor will operate as a phase discriminator, means deriving a direct current output signal from the emitter of the second transistor when the phase of the input signal is the same as the phase of the alternating current source including a capacitor in the emitter circuit of the second transistor across which the direct current output signal is developed, means applying the direct current output signal on the base of the third transistor including a resistor coupling the emitter of the second transistor and the base of the third transistor, the emitter of the third transistor being connected to a point of ground potential, and means deriving an amplified direct current output signal from the collector of the third transistor.

8. A phase sensitive amplifying circuit arrangement including, a source of alternating current potential, an input signal source energized from said source of alternating current for developing an input signal, the phase of said input signal being either the same or opposed to the phase of the source of alternating current, first, second and third transistors each having a base, a collector and an emitter, means for impressing the input signal on the base of the first transistor, means deriving an amplified output signal from the collector of the first transistor, the emitter of the first transistor being connected to a point of ground potential, a full wave rectifier connected to said alternating current source, means connecting the full wave rectifier with collectors of the first and third transistors, a half wave rectifier connected to said alternating current source, means impressing the output signal of the first transistor on the base of the second transistor, means connecting the collector of the second transistor with said half wave rectifier whereby the second transistor will operate as a phase discriminator, means deriving a direct current output signal from the emitter of the second transistor when the phase of the input signal is the same as the phase of the alternating current source, means applying the direct current output signal on the base of the third transistor, the emitter of the third transistor being connected to a point of ground potential, means deriving an amplified direct current output signal from the collector of the third transistor, and a resistive network supplying base bias to the first transistor for stabilizing the gain of the amplifying circuit arrangement during variations in the potential of the alternating current source.

References Cited in the file of this patent

UNITED STATES PATENTS

| | | |
|---|---|---|
| 2,774,021 | Ehret | Dec. 11, 1956 |
| 2,799,784 | Harris et al. | July 16, 1957 |
| 2,820,143 | D'Neilly | Jan. 14, 1958 |
| 2,833,938 | Pinckaers | May 6, 1958 |
| 2,837,662 | Ehret | June 3, 1958 |
| 2,846,630 | Boyle et al. | Aug. 5, 1958 |
| 2,872,595 | Pinckaers | Feb. 3, 1959 |
| 2,879,456 | Pinckaers | Mar. 24, 1959 |